United States Patent
Leyh et al.

(10) Patent No.: US 10,992,450 B1
(45) Date of Patent: Apr. 27, 2021

(54) SIGNAL PROCESSING METHOD AND SIGNAL ANALYSIS MODULE

(71) Applicant: Rohde & Schwarz GmbH & Co. KG, Munich (DE)

(72) Inventors: Julian Leyh, Munich (DE); Bendix Koopmann, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 16/809,947

(22) Filed: Mar. 5, 2020

(51) Int. Cl.
*H04L 7/033* (2006.01)
*H03L 7/095* (2006.01)
*H04L 7/10* (2006.01)

(52) U.S. Cl.
CPC ............ *H04L 7/0331* (2013.01); *H03L 7/095* (2013.01); *H03L 2207/50* (2013.01); *H04L 7/10* (2013.01)

(58) Field of Classification Search
CPC ... H03L 7/095; H03L 2207/50; H04L 7/0331; H04L 7/10
USPC ........................................................ 375/376
See application file for complete search history.

(56) References Cited

U.S. PATENT DOCUMENTS 8,208,594 B2  6/2012 Villarino-Villa et al.

FOREIGN PATENT DOCUMENTS

CN        103475619 A  * 12/2013
WO       2009/039923 A1     4/2009

* cited by examiner

*Primary Examiner* — Leila Malek
(74) *Attorney, Agent, or Firm* — Christensen O'Connor Johnson Kindness PLLC

(57) ABSTRACT

A signal processing method is described. The signal processing method comprises the following steps: An input signal is received. The input signal is processed from a start point to a preliminary stop point based on at least one first processing parameter, thereby obtaining a first processed signal. The at least one first processing parameter is adapted based on the first processed signal, thereby obtaining at least one second processing parameter. The input signal is processed from the preliminary stop point to the start point based on the at least one second processing parameter, thereby obtaining a second processed signal. At least one output parameter is generated and/or an output signal is synchronized with the input signal based on the second processed signal. Further, a signal analysis module is described.

18 Claims, 2 Drawing Sheets

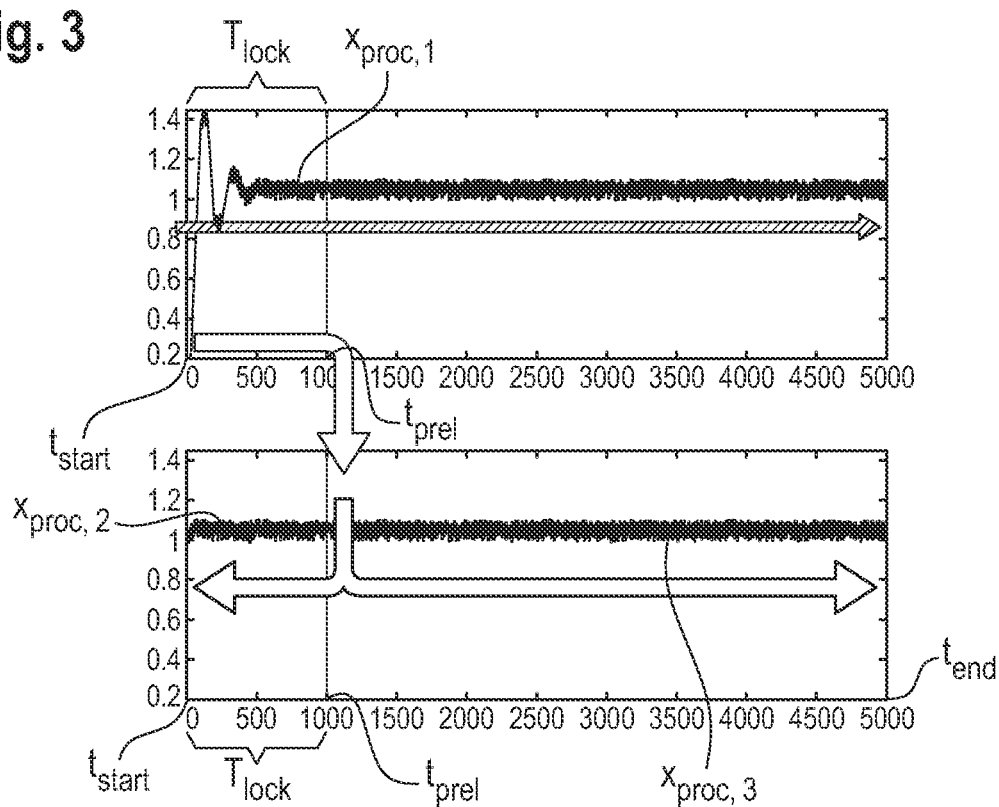
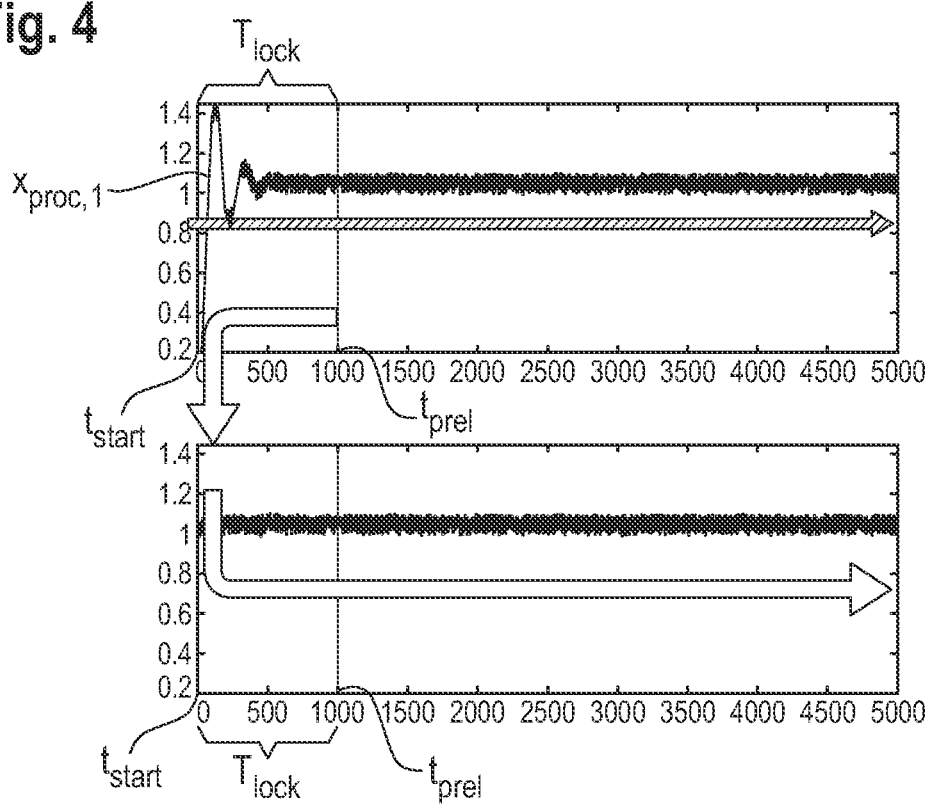

SIGNAL PROCESSING METHOD AND SIGNAL ANALYSIS MODULE

FIELD OF THE DISCLOSURE

Embodiments of the present disclosure generally relate to a signal processing method. Embodiments of the present disclosure further relate to a signal analysis module.

BACKGROUND

It is known to employ so-called phase-locked loops (PLLs) in order to recover a clock underlying a data signal from the data signal or in order to synchronize an output signal with an input signal. For example, such phase-locked loops are incorporated into measurement instruments such as oscilloscopes.

An inherent property of these phase-locked loops is that the PLLs need a certain time in order to lock to an input signal that is processed by the respective PLL.

Thus, only samples acquired after the PLL has locked to the input signal can be used for analyzing the input signal, for example for recovering the clock underlying a data signal. In the state of the art, all samples that have been acquired up to that point have to be discarded.

Moreover, if the locking time of the PLL is longer than the input signal itself, for example in the case of short signal portions such as signal bursts, the PLL does not lock to the input signal and the input signal cannot be analyzed.

Accordingly, there is a need for a signal processing method that allows for a better utilization of the input signal samples and/or for an analysis of short signal portions.

SUMMARY

Embodiments of the present disclosure provide a signal processing method. In an embodiment, the signal processing method comprises the following steps. An input signal is received. The input signal is processed from a start point to a preliminary stop point based on at least one first processing parameter, thereby obtaining a first processed signal. The at least one first processing parameter is adapted based on the first processed signal, thereby obtaining at least one second processing parameter. The input signal is processed from the preliminary stop point to the start point based on the at least one second processing parameter, thereby obtaining a second processed signal. At least one output parameter is generated and/or an output signal is synchronized with the input signal based on the second processed signal.

Therein and in the following, the terms "start point" and "preliminary stop point" are understood to denote points in time, wherein the start point is prior (in time) to the preliminary stop point.

The signal processing method according to the disclosure based on the idea to process the input signal for a second time from the preliminary stop point to the start point, i.e. backwards in time. This second processing of the portion is based on the at least one second processing parameter, which is already adapted to the input signal.

In corresponding signal processing methods in the state of the art, the portion of the input signal between the start point and the preliminary stop point usually has to be discarded because the at least one first processing parameter is not yet adapted to the input signal.

In contrast to the prior art, the complete input signal can be utilized for generating the at least one output parameter and/or for synchronizing the output signal with the input signal. Thus, memory capacity can be reduced/used otherwise and/or the accuracy of the generated output parameter is enhanced.

In some embodiments, the input signal may be an n-ary signal comprising a symbol sequence, wherein each of the symbols has one of n different amplitude values. In some embodiments, the input signal may be PAM-n coded.

It is noted that processing the input signal for a second time backwards in time could also be described as processing a mirrored version of the input signal forwards in time, wherein the input signal is mirrored at the preliminary stop point. This method, however, corresponds to a plain re-parameterization of the method described above and thus also falls into the scope of the present disclosure.

According to an aspect of the present disclosure, the at least one output parameter comprises a symbol period of a symbol sequence comprised in the input signal and/or a clock frequency of a clock signal underlying the input signal. As already described above, the complete input signal can be utilized for determining the at least one output parameter. Thus, the accuracy of the determined symbol period of the symbol sequence and/or the accuracy of the determined clock frequency is enhanced.

According to another aspect of the present disclosure, the input signal is processed via a phase-locked loop circuit or module. Typically, phase-locked loops comprise a phase comparator, a filter and a controlled oscillator for generating a processed signal. The at least one first processing parameter corresponds to at least one parameter of at least one of these components.

In some embodiments, the at least one first processing parameter is established as a control parameter of the controlled oscillator that defines the frequency of the processed signal of the controlled oscillator.

The controlled oscillator may be established as a voltage controlled oscillator or as a numerically controlled oscillator.

In a further embodiment of the present disclosure, the stop point corresponds to a locking time at which the phase-locked loop module locks to the input signal. In the state of the art, portions of the input signal up to the locking time of the phase-locked loop have to be discarded because the phase-locked loop is not yet locked to the input signal. The signal processing method according to the disclosure solves this problem by processing the input signal portion up to the locking time for a second time. Thus, the complete input signal can be processed by the phase-locked loop and the complete processed signal generated by the phase-locked loop can be used for further analysis of the input signal. This is particularly advantageous if the input signal itself is rather short, such that it is desirable to utilize as much of the input signal as possible.

The phase-locked loop module may be established as a software module. However, it is to be understood that the phase-locked loop module may also be established as hardware or as a combination of hardware and software.

According to a further aspect of the present disclosure, the input signal is additionally processed from the preliminary stop point to a point being later than the preliminary stop point based on the at least one second processing parameter, thereby generating a third processed signal. Thus, the complete input signal is utilized for generating the at least one output parameter and/or for synchronizing the output signal with the input signal.

Accordingly, in the case of the phase-locked-loop module, the portion of the input signal after the phase-locked loop has locked to the input signal is additionally processed.

In a further embodiment of the present disclosure, the at least one output parameter is generated and/or the output signal is synchronized based on the third processed signal. In other words, also the portion of the input signal after the preliminary stop point is utilized for generating the at least one output parameter and/or for synchronizing the output signal with the input signal.

In some embodiments, the second processed signal and the third processed signal are obtained via separate phase-locked loop modules. In some embodiments, the two separate phase-locked loop modules may be configured identically, such that the second processed signal and the third processed signal are obtained in a comparable way. Moreover, the at least one second processing parameter can be utilized by both phase-locked loop modules without further adaptations if the phase-locked loop modules are configured identically.

However, the two phase-locked loop modules may also be configured different from each other.

According to another aspect of the present disclosure, the at least one second processing parameter is forwarded from one phase-locked loop module to another phase-locked loop module. In other words, the at least one second processing parameter is transferred, for instance copied, from phase-locked loop module to the other.

The first processed signal and the second processed signal may each comprise information on transition timings, wherein the input signal crosses at least one predefined threshold value at the transition timings. Accordingly, information on a symbol sequence comprised in the input signal and/or information on a clock underlying the input signal may be comprised in the second processed signal.

Embodiments of the present disclosure further provide a signal processing method. In an embodiment, the signal processing method comprises the following steps. An input signal is received. The input signal is processed from a start point to a preliminary stop point based on at least one first processing parameter, thereby obtaining a first processed signal. The at least one first processing parameter is adapted based on the first processed signal, thereby obtaining at least one second processing parameter. The input signal is processed from the preliminary stop point to the start point based on the at least one second processing parameter, thereby obtaining a second processed signal. The at least one second processing parameter is adapted based on the second processed signal, thereby obtaining at least one third processing parameter. The input signal is processed from the start point to the preliminary stop point based on the at least one third processing parameter, thereby obtaining a third processed signal. At least one output parameter is generated and/or an output signal is synchronized with the input signal based on the third processed signal.

As in the embodiments described above, the input signal is processed for a second time backwards in time. In addition, the input signal is processed a third time forwards in time, namely from the start point to the preliminary stop point.

This is particularly advantageous, if the input signal is very short, e.g. if the input signal is a pulsed signal with a narrow pulse width. Even input signals having a very narrow pulse width can be analyzed without discarding portions of the input signal.

Regarding the remaining advantages and properties of this embodiment of the signal processing method, reference is made to the explanations given above with respect to the other embodiment of the signal processing method, which also hold for this embodiment of the signal processing method and vice versa.

According to an aspect of the present disclosure, the at least one output parameter comprises a symbol period of a symbol sequence comprised in the input signal and/or a clock frequency of a clock signal underlying the input signal. As already described above, the complete input signal can be utilized for determining the at least one output parameter. Thus, the accuracy of the determined symbol period of the symbol sequence and/or the accuracy of the determined clock frequency is enhanced.

According to another aspect of the present disclosure, the input signal is processed via a phase-locked loop module. Usually, phase-locked loops need a certain locking time in order to lock to an input signal. Thus, in the state of the art it may be impossible to process very short signals via phase-locked loops if the locking time of the phase-locked loop is longer than the input signal. However, by processing the input signal several times forwards and backwards in time, it is possible to process even very short input signals via phase-locked loops.

In some embodiments, the stop point corresponds to an end point of the input signal. In the context of the present disclosure, it is understood that the "end point" of the input signal corresponds to the time at which the input signal becomes substantially zero.

Embodiments of the present disclosure further provide a signal analysis circuit or module. The signal analysis module comprises an input and a processing circuit or module. The input is configured to receive an input signal. The processing module is configured to process the input signal from a start point to a preliminary stop point based on at least one first processing parameter, thereby obtaining a first processed signal. The processing module is configured to adapt the at least one first processing parameter based on the first processed signal, thereby obtaining at least one second processing parameter. The processing module is configured to process the input signal from the preliminary stop point to the start point based on the at least one second processing parameter, thereby obtaining a second processed signal. The processing module is configured to generate at least one output parameter and/or to synchronize an output signal with the input signal based on the second processed signal.

Regarding the advantages and properties of the signal analysis module, reference is made to the explanations given above with respect to the signal processing method, which also hold for the signal analysis module and vice versa.

According to an aspect of the present disclosure, the analysis module is established as a software module. However, it is to be understood that the phase-locked loop module may also be established as hardware or as a combination of hardware and software.

According to another aspect of the present disclosure, the processing module comprises at least one phase-locked loop module. Typically, phase-locked loops comprise a phase comparator, a filter and a controlled oscillator for generating a processed signal. The at least one first processing parameter corresponds to at least one parameter of at least one of these components.

In a further embodiment of the present disclosure, the processing module is configured to process the input signal from the preliminary stop point to a point being later than the preliminary stop point based on the at least one second processing parameter, thereby generating a third processed signal. Thus, the complete input signal is utilized for generating the at least one output parameter and/or for synchronizing the output signal with the input signal The processing module may comprise two phase-locked loop modules, wherein one of the phase-locked loop modules is associated with the second processed signal and the other one of the phase-locked loop modules is associated with the third processed signal. In some embodiments, the two phase-locked loop modules may be configured identically, such that the second processed signal and the third processed signal are obtained in a comparable way. Moreover, the at least one second processing parameter can be utilized by both phase-locked loop modules without further adaptations if the phase-locked loop modules are configured identically.

However, the two phase-locked loop modules may also be configured different from each other.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

FIG. 3 shows a diagram of an input signal frequency that is estimated according to two different methods plotted against time; and FIG. 4 shows a further diagram of an input signal frequency that is estimated according to two different methods plotted against time.

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
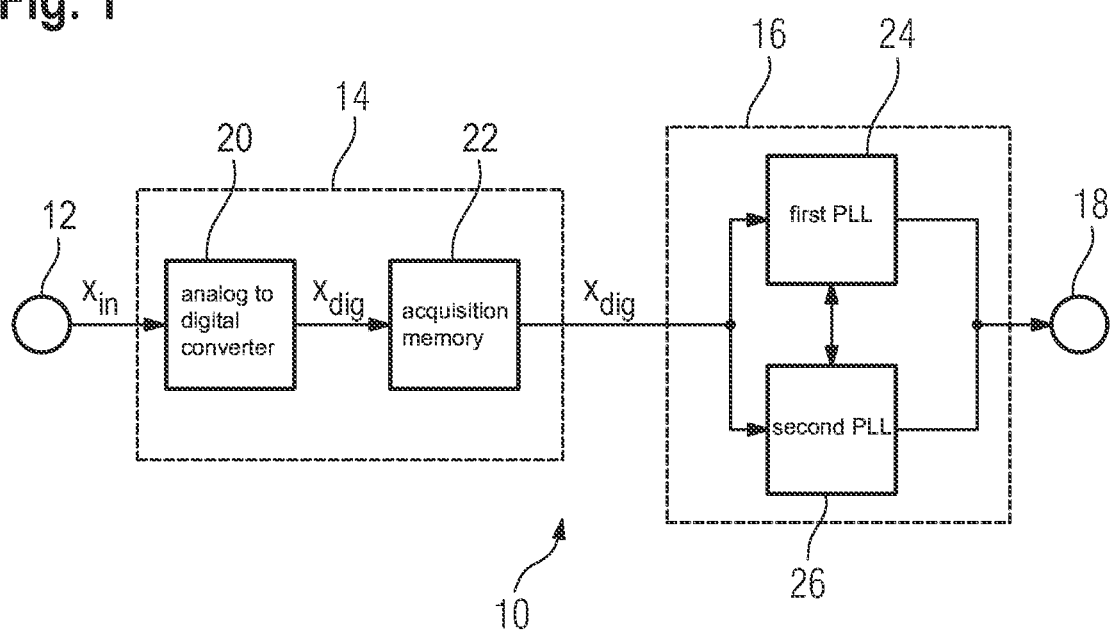
FIG. 1 shows a block diagram of a signal analysis module according to an embodiment of the disclosure.

FIG. 1 schematically shows a signal analysis circuit(s) or module 10 comprising an input 12, an acquisition circuit(s) or module 14, a processing circuit(s) or module 16 and an output 18. Generally, the signal analysis module 10 may be part of a measurement instrument, for example of an oscilloscope or of a vector network analyzer. In some embodiments, the signal analysis module 10 may be part of a gigabit passive optical network.

As used herein, the term "module" is understood to denote components that comprise suitable hardware and/or software. Thus, the term "module" comprises the meanings "pure software", "pure hardware" and "combination of software and hardware", as will be appreciated by the person skilled in the art.

The acquisition module 14 comprises an analog to digital converter 20 and an acquisition memory 22. The processing module 16 comprises a first phase-locked loop circuit(s) or module 24 and a second phase-locked loop circuit(s) or module 26.

In the following, an exemplary embodiment is described, according to which the first phase-locked loop module 24 and the second phase-locked loop module 26 are each established as pure software modules. However, it is to be understood that one or both of the phase-locked loop modules 24, 26 may be established as hardware or as a combination of hardware and software.

The analog to digital converter 20 is connected to the input 12 downstream of the input 12. In the context of the present disclosure, the terms "downstream" and "upstream" are understood to denote directions of signal propagation within the signal analysis module 10, wherein electrical signals propagate from the upstream component to the downstream component. In FIG. 1, the directions of signal propagation are indicated by the respective arrows.

The acquisition memory 22 is connected to the analog to digital converter 20 downstream of the analog to digital converter 20. The first phase-locked loop module 24 and the second phase-locked loop module 26 are each connected to the acquisition memory 22 downstream of the acquisition memory 22. Additionally, the first phase-locked loop module 24 and the second phase-locked loop module 26 may be connected with each other in a signal transmitting manner. The output 18 is connected to both the first phase-locked loop module 24 and the second phase-locked loop module 26 downstream of the phase-locked loop modules 24, 26.

Figure 2:
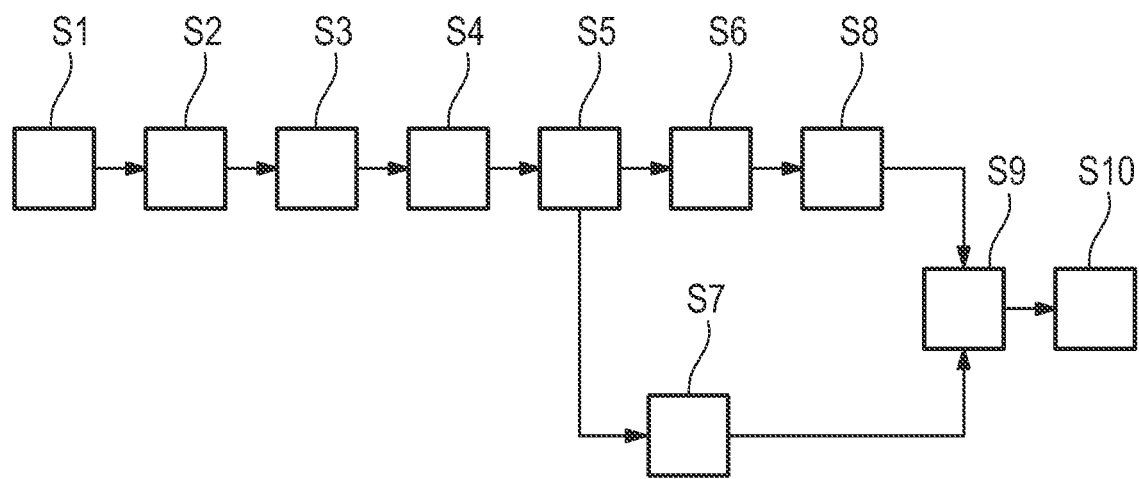
FIG. 2 shows a flow chart of a signal processing method according to an embodiment of the disclosure.

The signal analysis module 10 is configured to perform the signal processing method described in the following with reference to FIG. 2.

An input signal $x_{in}$ is received via the input 12 (step S). In the exemplary embodiment described in the following, the input signal is established as an analog input signal. However, it is to be understood that the input signal $x_{in}$ may also be established as a digital input signal, in which case the analog to digital converter 20 may be omitted or bypassed, such that the input signal $x_{in}$ is directly forwarded to the acquisition memory 22.

The input signal $x_{in}$ may be an n-ary signal comprising a symbol sequence, wherein each of the symbols has one of n different amplitude values. In some embodiments, the input signal $x_{in}$ may be PAM-n coded.

The received input signal $x_{in}$ is digitized by the analog to digital converter 20, such that a digitized input signal $x_{dig}$ is obtained (step S2).

The digitized input signal $x_{dig}$ comprises a series of samples that are discrete in amplitude and time, wherein the samples correspond to the original input signal $x_{in}$.

Accordingly, the digitized input signal $x_{dig}$ can be represented as a vector $x_{dig} = (x_1, x_2, \ldots, x_N)$, wherein N is a natural number that is equal to the number of acquired samples. Therein, the abbreviation $x_i = x(t_i)$ is used, such that $x_{in}$ is the value of the digitized input signal $x_{dig}$ at time $t_i$.

The times $t_i$ are monotonically increasing, for example strictly monotonically increasing. Thus, $t_i$ corresponds to a later point in time than $t_j$ if i is bigger than j.

The digitized input signal $x_{dig}$ is stored in the acquisition memory 22 and is forwarded to the processing module (step S3). More precisely, the digitized input signal $x_{dig}$ is forwarded to the first phase-locked loop module 24 and to the second phase-locked loop module 26.

Accordingly, in step S3 the input vector of the first phase-locked loop module 24 and the second phase-locked loop module 26 is $x_{dig} = (x_1, x_2, \ldots, x_N)$.

The digitized input signal $x_{dig}$ is then processed by the first phase-locked loop module 24 from a start point $t_{start}$ to a preliminary stop point $t_{prel}$ based on at least one first processing parameter of the first phase-locked loop module (step S4).

Typically, phase-locked loops comprise a phase comparator, a filter and a controlled oscillator for generating a processed signal. The controlled oscillator may be established as a voltage controlled oscillator or as a numerically controlled oscillator.

The at least one first processing parameter corresponds to at least one parameter of at least one of these components. In some embodiments, the at least one first processing parameter is established as a control parameter of the controlled oscillator that defines the frequency of the processed signal of the controlled oscillator.

The start point $t_{start}$ is equal to one of the times t of the samples of the digitized input signal $x_{dig}$, while $t_{prel}$ is equal to one of the times $t_j$ of the samples of the digitized input signal $x_{dig}$ that is later than $t_i$.

In other words, the first phase-locked loop module 24 processes a portion of the digitized input signal $x_{dig}$ that is defined by the vector $x_p = (x_{start}, x_{start+1}, \ldots, x_{prel})$.

Depending on the type and length of the input signal $x_{in}$, there are different possibilities for the preliminary stop point.

If the length of the digitized input signal $T=t_N-t_1$ is longer than a locking time of the first phase-locked loop module 24, then the preliminary stop point $t_{prel}$ is the locking time at which the first phase-locked loop module 24 locks to the digitized input signal.

Generally speaking, the first phase-locked loop module 24 processes the digitized input signal portion by portion from the start point to the preliminary stop point. Therein, the first phase-locked loop module 24 continuously generates a first processed signal $x_{proc,1}$ via the controlled oscillator.

During processing of the digitized input signal $x_{dig}$, the at least one first processing parameter is adapted until the first phase-locked loop module 24 locks to the digitized input signal $x_{dig}$, thereby obtaining at least one second processing parameter (step S5).

The locking procedure is illustrated in the upper diagram in FIG. 3. In the vicinity of the start point $t_{start}$, the first processed signal $x_{proc,1}$ oscillates around a central value in a dampened fashion until the first phase-locked loop module 24 locks to the digitized input signal $x_{dig}$ at the preliminary stop point $t_{prel}$ after the locking time $T_{lock}$.

The obtained at least one second processing parameter is forwarded to the second phase-locked loop module 26 (step S6).

Accordingly, the first phase-locked loop module 24 and the second phase-locked loop module 26 are configured identically at the time $t_{prel}$.

In some embodiments, the second phase-locked loop module 26 is already locked to the digitized input signal $x_{dig}$ at the time $t_{prel}$, because the first phase-locked loop module 24 is locked to the digitized input signal $x_{dig}$ at that time.

The digitized input signal $x_{dig}$ is then processed from the preliminary stop point $t_{prel}$ to the start point $t_{start}$ by the first phase-locked loop module 24 based on the at least one second processing parameter, thereby obtaining a second processed signal $x_{proc,2}$ (step S7). This step is illustrated in the lower diagram of FIG. 3.

In other words, the portion of the digitized input signal between the start point $t_{start}$ and the preliminary stop point $t_{prel}$ is processed a second time, but backwards in time from the preliminary stop point $t_{prel}$ to the start point $t_{start}$.

The second processing of the portion is based on the at least one second processing parameter. Thus, the first phase-locked loop module 24 is already locked to the digitized input signal $x_{dig}$ at the start of the second processing of the digitized input signal.

Moreover, the digitized input signal $x_{dig}$ is processed from the preliminary stop point $t_{prel}$ to a point $t_{end}$ being later than the preliminary stop point $t_{prel}$ by the second phase-locked loop module 26 based on the at least one second processing parameter, thereby obtaining a third processed signal $x_{proc,3}$ (step S8).

The processing of the portion of the digitized input signal $x_{dig}$ after the preliminary stop point $t_{prel}$ is based on the at least one second processing parameter. Thus, the second phase-locked loop module 26 is already locked to the digitized input signal $x_{dig}$ at the start of the processing of the digitized input signal $x_{dig}$.

The second processed signal $x_{proc,2}$ and the third processed signal $x_{proc,3}$ are forwarded to the output 18 (step S9).

Generally speaking, the second processed signal $x_{proc,2}$ and the third processed signal $x_{proc,3}$ correspond to the output signal of the respective controlled oscillator, wherein the output signal of the controlled oscillators are synchronized with the respective portion of the digitized input signal $x_{dig}$ and thus with the input signal $x_{in}$.

As the second processed signal $x_{proc,2}$ and the third processed signal $x_{proc,3}$ each are synchronized with the digitized input signal $x_{dig}$, the second processed signal $x_{proc,2}$ and the third processed signal $x_{proc,3}$ each comprise information on transition timings at which the input signal $x_{in}$ crosses predefined threshold values and on a clock signal underlying the input signal $x_{in}$.

The second processed signal $x_{proc,2}$ and the third processed signal $x_{proc,3}$ together cover all samples of the digitized input signal $x_{dig}$. Accordingly, a synchronized output signal is obtained for the complete digitized input signal $x_{proc,2}$ and no samples have to be discarded because of a locking process of the phase-locked loop modules 24, 26.

The second processed signal $x_{proc,2}$ and the third processed signal $x_{proc,3}$ may be forwarded to an analysis module for further analysis of the input signal (step S10).

In some embodiments, the clock signal underlying the input signal $x_{in}$ may be recovered based on the second processed signal $x_{proc,2}$ and the third processed signal $x_{proc,3}$. Thus, also a symbol duration or rather a symbol period of symbols in the symbol sequence may be determined.

Alternatively or additionally, the symbol sequence comprises in the input signal $x_{in}$ may be decoded.

Accordingly, the complete digitized input signal $x_{dig}$ is processed and can afterwards be used for further analysis of the input signal $x_{in}$, for example for recovering the clock signal underlying the input signal $x_{in}$.

Alternatively or additionally, jitter and/or noise comprised in the input signal $x_{in}$ may be analyzed by the analysis module.

FIG. 4 illustrates another embodiment of the signal processing method described above, wherein only the differences compared to the method described above will be described in the following.

This variant of the signal processing method can be performed with only a single phase-locked loop module 24.

Up to step S5, the method is substantially identical to the signal processing method described above. Therefore, reference is made to the embodiment described above.

However, instead of processing the portion of the digitized input signal $x_{dig}$ after the preliminary stop point $t_{prel}$ with another phase-locked loop module 26, the complete digitized input signal $x_{dig}$ is processed via the first phase-locked loop module 24 from the start point $t_{start}$ once again forward in time after step S7, i.e. after processing the portion between the start point $t_{start}$ and the preliminary stop point $t_{prel}$ backwards in time.

The method described above works as long as the time length of the digitized input sample is bigger than the locking time $T_{lock}$ of the first phase-locked module.

If, however, the time length of the digitized input signal $x_{dig}$ is smaller than the locking time $T_{lock}$ of the first phase-locked module, the signal processing method is adapted as described in the following. This may, for example, be the case for pulsed input signals with very short low pulse width.

Up to step S5, the method is substantially the same as described above. The only difference is that the preliminary stop point $t_{prel}$ now corresponds to an end point of the input signal $x_{in}$.

In other words, the digitized input signal $x_{dig}$ is processed over its full duration by the first phase-locked loop module 24, thereby obtaining a first processed signal.

During the processing of the digitized input signal $x_{dig}$, the at least one first processing parameter is adapted, such that at least one second processing parameter is obtained. However, the at least one second processing parameter does not correspond to a locked state of the first phase-locked loop module 24, because the locking time is longer than the duration of the input signal $x_{in}$.

The digitized input signal $x_{dig}$ is then processed from the preliminary stop point to the start point by the first phase-locked loop module 24 based on the at least one second processing parameter, thereby obtaining a second processed signal.

In other words, the portion of the digitized input signal $x_{dig}$ between the start point $t_{start}$ and the preliminary stop point $t_{prel}$ is processed a second time, but backwards in time from the preliminary stop point $t_{prel}$ to the start point $t_{start}$.

The second processing of the portion is based on the at least one second processing parameter. Thus, at the start of the second processing of the digitized input signal $x_{dig}$, the first phase-locked loop is closer to the locked state than at the start of the first processing of the digitized input signal $x_{dig}$.

During the processing of the digitized input signal $x_{dig}$, the at least one second processing parameter is adapted, such that at least one third processing parameter is obtained.

If the first phase-locked loop module 24 still is not locked to the digitized input signal $x_{dig}$, the digitized input signal $x_{dig}$ can be processed a third time, based on the third processing parameter and forward in time from the start point to the preliminary stop point. This procedure can be repeated until the first phase-locked loop 24 locks to the input signal $x_{in}$ and at least one final processing parameter of the first phase-locked loop module 24 is obtained.

Based on the at least one final processing parameter, the digitized input signal $x_{dig}$ is processed one more time by the first phase-locked loop module 24, thereby obtaining a final processed signal.

Steps S9 and S10 described above can then be performed for the final processed signal.

Accordingly, the signal processing method according to the disclosure allows processing input signals that have a duration that is shorter than the locking time of the first phase-locked loop module 24.

Certain embodiments disclosed herein utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A signal processing method, said signal processing method comprising:
   receiving an input signal;
   processing said input signal from a start point to a preliminary stop point based on at least one first processing parameter, thereby obtaining a first processed signal;

adapting said at least one first processing parameter based on said first processed signal, thereby obtaining at least one second processing parameter;

processing said input signal from said preliminary stop point to said start point based on said at least one second processing parameter, thereby obtaining a second processed signal; and at least one of generating at least one output parameter and synchronizing an output signal with said input signal based on said second processed signal.

2. The signal processing method of claim 1, wherein said at least one output parameter comprises at least one of a symbol period of a symbol sequence comprised in said input signal and a clock frequency of a clock signal underlying said input signal.

3. The signal processing method of claim 1, wherein said input signal is processed via a phase-locked loop module.

4. The signal processing method of claim 3, wherein said preliminary stop point corresponds to a locking time at which said phase-locked loop module locks to said input signal.

5. The signal processing method of claim 4, wherein said phase-locked loop module is established as a software module.

6. The signal processing method of claim 1, wherein said input signal is additionally processed from said preliminary stop point to a point being later than said preliminary stop point based on said at least one second processing parameter, thereby generating a third processed signal.

7. The signal processing method of claim 6, wherein said at least one output parameter is generated and/or said output signal is synchronized based on said third processed signal.

8. The signal processing method of claim 6, wherein said second processed signal and said third processed signal are obtained via separate phase-locked loop modules.

9. The signal processing method of claim 8, wherein said at least one second processing parameter is forwarded from one phase-locked loop module to another phase-locked loop module.

10. The signal processing method of claim 1, wherein said first processed signal and said second processed signal each comprise information on transition timings, wherein said input signal crosses at least one predefined threshold value at said transition timings.

11. A signal processing method, said signal processing method comprising:
receiving an input signal;
processing said input signal from a start point to a preliminary stop point based on at least one first processing parameter, thereby obtaining a first processed signal;
adapting said at least one first processing parameter based on said first processed signal, thereby obtaining at least one second processing parameter;
processing said input signal from said preliminary stop point to said start point based on said at least one second processing parameter, thereby obtaining a second processed signal;

adapting said at least one second processing parameter based on said second processed signal, thereby obtaining at least one third processing parameter;
processing said input signal from said start point to said preliminary stop point based on said at least one third processing parameter, thereby obtaining a third processed signal; and
at least one of generating at least one output parameter and synchronizing an output signal with said input signal based on said third processed signal.

12. The signal processing method of claim 11, wherein said at least one output parameter comprises at least one of a symbol period of a symbol sequence comprised in said input signal and a clock frequency of a clock signal underlying said input signal.

13. The signal processing method of claim 11, wherein said input signal is processed via a phase-locked loop module.

14. The signal processing method of claim 11, wherein said preliminary stop point corresponds to an end point of said input signal.

15. A signal analysis apparatus, comprising:
an input; and
a processing circuit,
said input being configured to receive an input signal,
said processing circuit being configured to process said input signal from a start point to a preliminary stop point based on at least one first processing parameter, thereby obtaining a first processed signal;
said processing circuit being configured to adapt said at least one first processing parameter based on said first processed signal, thereby obtaining at least one second processing parameter;
said processing circuit being configured to process said input signal from said preliminary stop point to said start point based on said at least one second processing parameter, thereby obtaining a second processed signal; and
said processing circuit being configured to at least one of generate at least one output parameter and synchronize an output signal with said input signal based on said second processed signal.

16. The signal analysis apparatus of claim 15, wherein said processing circuit comprises at least one phase-locked loop.

17. The signal analysis apparatus of claim 15, wherein said processing circuit is configured to process said input signal from said preliminary stop point to a point being later than said preliminary stop point based on said at least one second processing parameter, thereby generating a third processed signal.

18. The signal analysis apparatus of claim 17, wherein said processing circuit comprises two phase-locked loops, wherein one of said phase-locked loops is associated with said second processed signal and the other one of said phase-locked loops is associated with said third processed signal.

* * * * *